(12) United States Patent
Kuang et al.

(10) Patent No.: US 7,219,244 B2
(45) Date of Patent: May 15, 2007

(54) CONTROL CIRCUITRY FOR POWER GATING VIRTUAL POWER SUPPLY RAILS AT DIFFERING VOLTAGE POTENTIALS

(75) Inventors: Jente Benedict Kuang, Austin, TX (US); Hung C. Ngo, Austin, TX (US); Kevin John Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 11/211,954

(22) Filed: Aug. 25, 2005

(65) Prior Publication Data

US 2007/0046323 A1 Mar. 1, 2007

(51) Int. Cl.
*G06F 1/32* (2006.01)
*G05F 1/10* (2006.01)
(52) U.S. Cl. .......................... 713/320; 327/544
(58) Field of Classification Search ............... 327/54; 713/320
See application file for complete search history.

(56) References Cited

U.S. PATENT DOCUMENTS 4,683,382 A * 7/1987 Sakurai et al. ............... 327/544

* cited by examiner

*Primary Examiner*—Evan Pert
(74) *Attorney, Agent, or Firm*—Winstead PC

(57) ABSTRACT

A single-stage level shifting circuit is used to interface control signals across the boundary between voltage domains with differing positive or ground voltage potentials Asserted states are determined by the difference between the positive voltages potentials and the ground potentials. A lower positive power supply potential is not used to turn OFF PFET coupled to a higher positive power supply potential. Likewise a higher ground power supply potential is not used to turn OF NFETs coupled to a power domain where is significant ground shift. The single stage level shifting circuit has keeper devices that hold asserted states using voltages within the power gated domain.

20 Claims, 15 Drawing Sheets

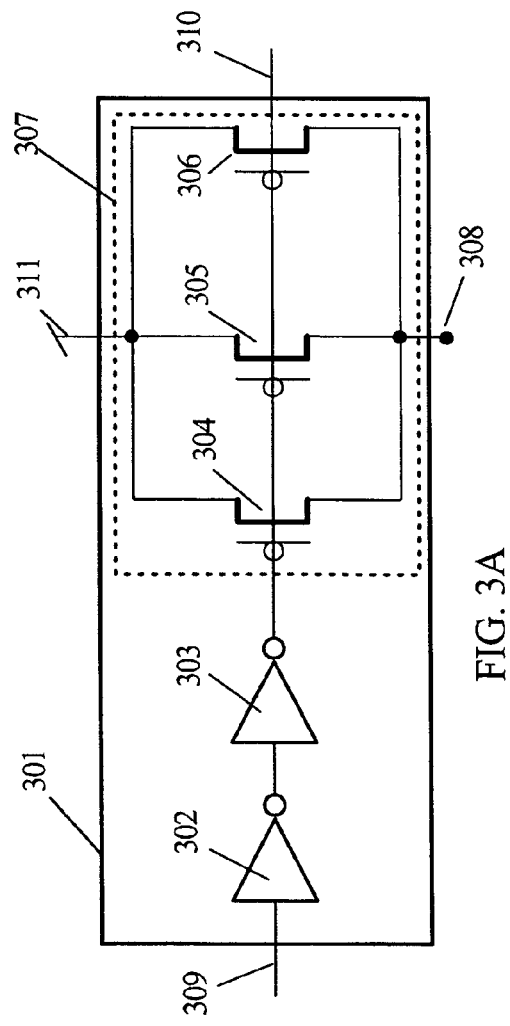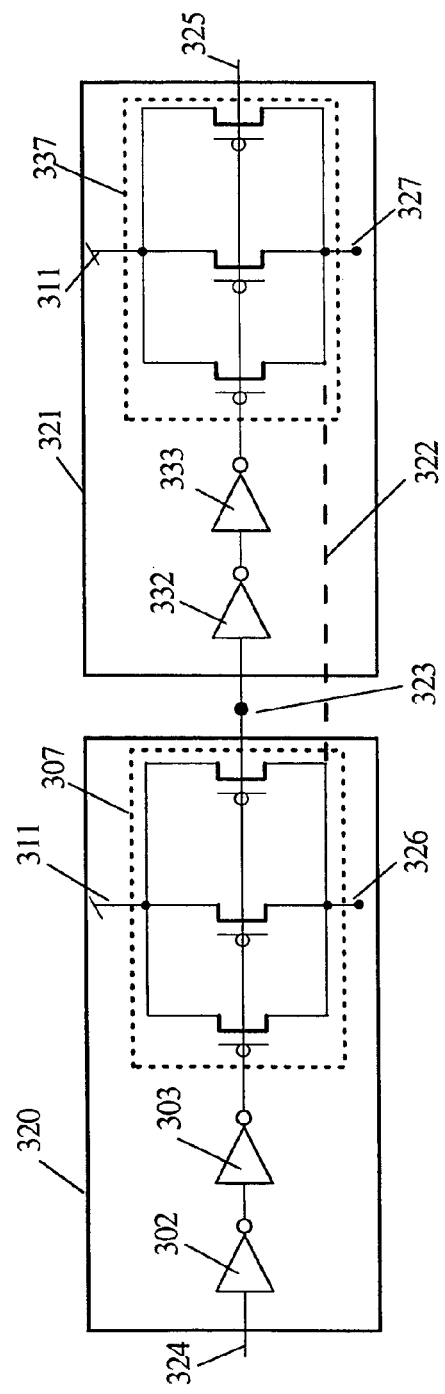
FIG. 3A
FIG. 3B

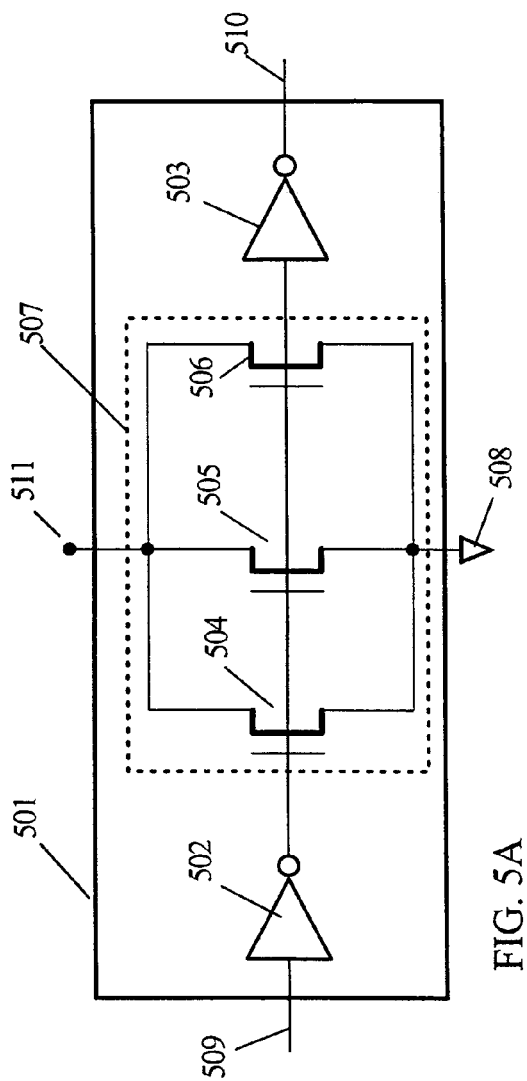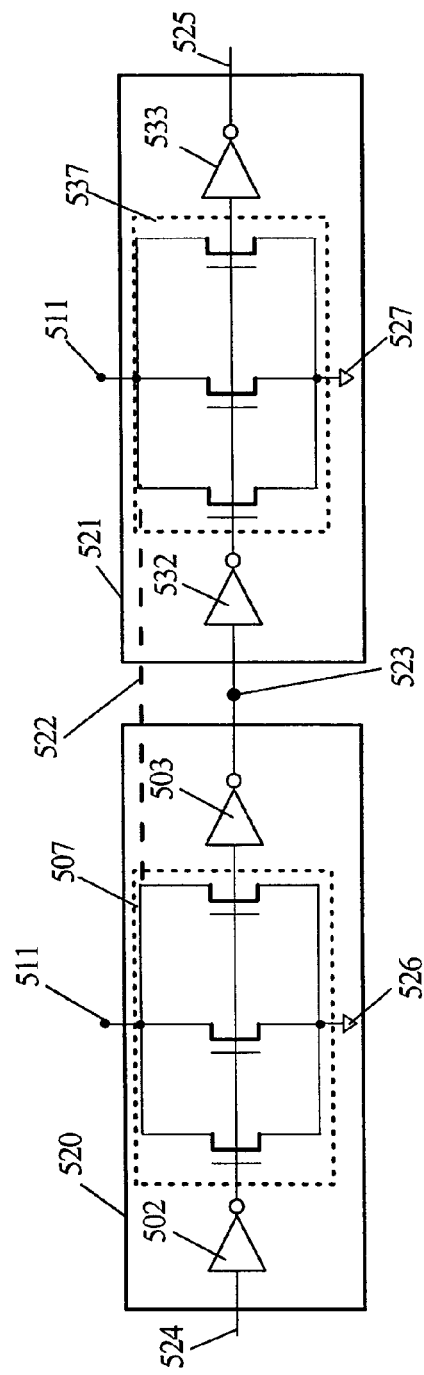
FIG. 5A
FIG. 5B

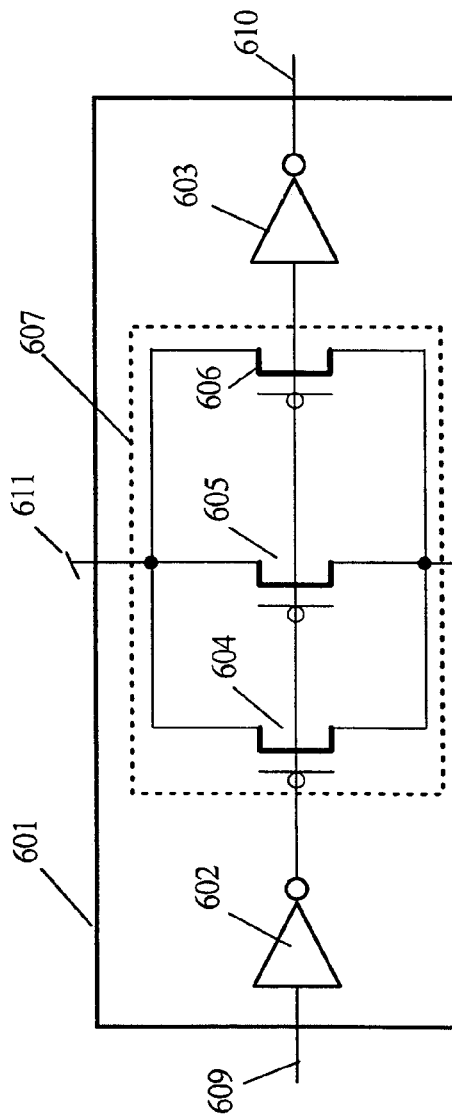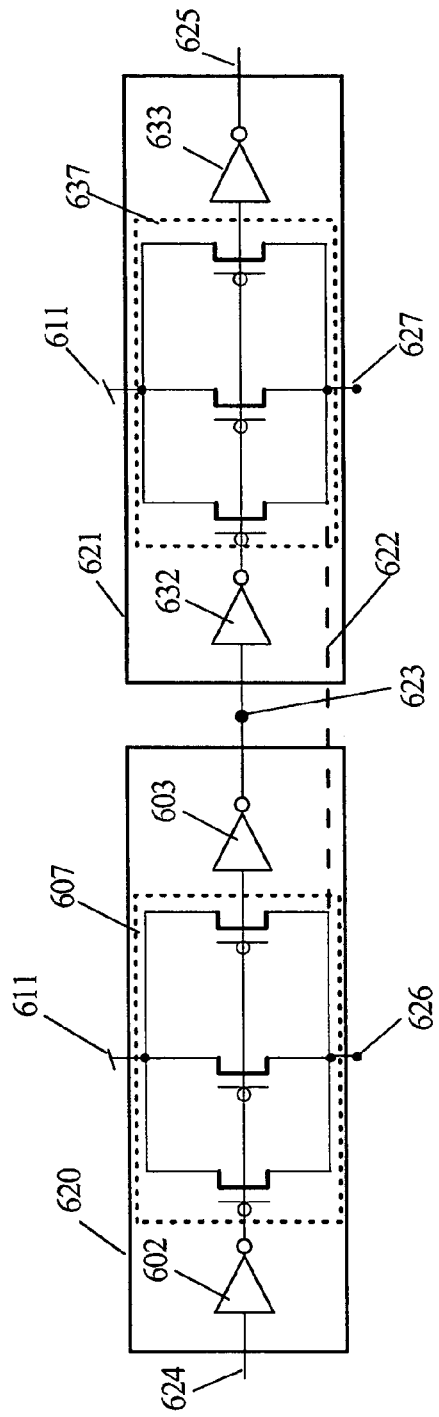
FIG. 6A
FIG. 6B

CONTROL CIRCUITRY FOR POWER GATING VIRTUAL POWER SUPPLY RAILS AT DIFFERING VOLTAGE POTENTIALS

GOVERNMENT RIGHTS

This invention was made with Government support under NBCH30390004, BGR W0132280 awarded by PERCS II. The Government has certain rights in this invention.

CROSS-REFERENCE TO RELATED APPLICATIONS

The present invention is related to U.S. patent application Ser. No. 10/821,047, filed Apr. 8, 2004, entitled "AN INTERFACE CIRCUIT FOR COUPLING BETWEEN LOGIC CIRCUIT DOMAINS,"

U.S. patent application Ser. No. 10/926,597, filed Aug. 26, 2004 entitled "A POWER-GATING CELL FOR VIRTUAL POWER RAILS,"

U.S. patent application Ser. No. 10/821,048, filed Apr. 8, 2004, entitled "BUFFER/DRIVER CIRCUITS," and U.S. patent application Ser. No. 10/835,501, filed Apr. 29, 2004, entitled "SELF LIMITING GATE LEAKAGE DRIVER," which are incorporated by reference herein.

TECHNICAL FIELD

The present invention relates in general to complementary metal oxide semiconductor (CMOS) circuits and, in particular, to circuit methodologies for implementing power-gating to control power and leakage.

BACKGROUND INFORMATION

Oxide tunneling current in metal oxide silicon (MOS) field effect transistors (FET) is a non-negligible component of power consumption as gate oxides get thinner, and may in the future become the dominant leakage mechanism in sub-100 nm complementary MOS (CMOS) circuits. The gate current is dependent on various conditions for a single transistor and three main static regions of operation may be identified for a MOSFET. The amount of gate-leakage current differs by several orders of magnitude from one region to another. Whether a transistor leaks significantly or not is also affected by its position in relation to other transistors within a CMOS circuit structure as this affects the voltage stress to which a particular device is subjected.

The three regions of operation are a function of applied bias if one only considers the parameters that affect the magnitude of gate current in a MOSFET as it operates in relation to other MOSFETs. Assuming that the supply voltage (Vdd) and the threshold voltage (Vt) are fixed, then a MOSFET in a static CMOS logic gate operates in one to the three regions, each with a significantly different amount of gate leakage.

The first region is called "strong inversion" and is the region where a MOSFET operates with the absolute value of the gate to source voltage (|VGS|) equal to Vdd. The gate-leakage current density for an N-channel FET (NFET) in strong inversion may be as high as $10^3$ amperes square centimeter ($A/cm^2$) for an oxide thickness of 1.5 nanometers (nm) at Vdd equal to 3 volts (V). For such a thin oxide, a more realistic value for Vdd is 1.2 V, in which case the gate-leakage current would more likely be 20 $A/cm^2$.

The second region is called the "threshold" region where |VGS|=Vt. A MOSFET operating in the threshold region will leak significantly less than one operating in the strong inversion region, typically 3 to 6 orders of magnitude less depending on Vdd and the oxide thickness.

The third region is called the "Off" region where |VGS|=0.0 V. For an NFET operating in the Off region, there is no leakage if the drain voltage (Vd)=0.0 V. However, if Vd is equal to Vdd, then a small leakage current in the reverse direction (drain to gate) may be present due to gate-drain overlap area. Of course this current depends on transistor geometry and is typically 10 orders of magnitude less than the gate-leakage current in the strong inversion region.

The above three regions represent three distinct conditions or states for the channel of a MOSFET. Whether an "ON" transistor operates at strong inversion or at threshold is determined by its position inside a logic circuit structure as well as by the state of other transistors in the circuit structure.

Both NFETs and P-channel FETs (PFETs) in a logic circuit structure operate in one of the three regions described above. However, the main tunneling current in a PFET device in strong inversion is due to hole tunneling from the valence band and the main tunneling current in an NFET device in strong inversion is due to electron tunneling from the conduction band. Because of this, PFET gate currents are about 10 times smaller than equivalent sized NFET devices. This fact is important in assessing gate-leakage in a static CMOS circuit.

Since gate leakage currents are measured as current density, it follows that the gate-leakage current in a MOSFET is directly proportional to the gate area (width times length). Transistor sizing, therefore, has a direct impact on the amount of gate-leakage in a CMOS logic circuit.

As CMOS circuits become smaller, leakage current that results when voltage is applied to the gate of the field effect transistors becomes a significant portion of the power dissipation. Leakage power may become the limiting factor in how small devices may be manufactured. As devices are made smaller, the power supply voltage is correspondingly reduced. However, this may not achieve an adequate reduction in leakage power dissipation. Alternate techniques are being employed to reduce leakage power. One popular technique is to use power-gating to isolate the power supply voltage in groups of circuits at controlled times. These circuits are sometimes referred to as being part of a power-gated domain. Other circuits may be evaluating a logic function and may not be in a power-gated domain. Interfacing between circuits in a power-gated domain and circuits in a non-power-gated domain may prove difficult. The state of an output from a power-gated domain may be uncertain during the time period of power-gating. While the benefits of power-gating are known, there is no consensus on strategies to preserve logic states of outputs in the power-gated domains. Since power-gated domains may be variable, the method of preserving output logic states from circuits in a power-gated domain are controlled by the power-gating control signals themselves.

The current drive capability of a CMOS buffer depends on the channel size of devices used to drive outputs or to drive many other logic gate inputs. Therefore, one would expect the large devices to exhibit large gate-leakage current when the technology has gate oxides that are very thin. Likewise, logic regions with a high number of logic gates may exhibit a large gate-leakage current due to the large number of devices that are in strong inversion at any one static time (between clock transitions). Logic regions with a high number of logic gates may employ power supply gating whereby the power to the logic devices are decoupled by the action MOSFETs, PFETs for the positive power supply voltage and NFETs for the negative power supply voltage. These regions where power supply gating is employed is sometimes referred to as "cuttable" regions. When a cuttable region is interfaced with a non-cuttable region, then logic states at the interface outputs may become indeterminate when power is decoupled.

While employing cuttable regions enables the leakage in an integrated circuit to be managed, controlling these regions may lead to significant overhead and present problems in implementing the cuttable regions. It would be desirable to have a method and scalable circuits modules or cells from which a designer could design the power distribution and control of the power-gated regions using virtual power supply rails that have control circuitry integrated within the virtual rail cells. This would allow the designer to customize power-gating using virtual rails in a systematic and defined fashion.

Often it is desirable to have power-gated domains operate at differing voltages levels to control power and leakage. However, if the non-power-gated domain generates control wake and sleep signals to interface with a power gated domain with a high power supply voltage, then the mismatch in voltage levels may lead to higher than desired leakage levels. In one case, a logic one level from one domain may not adequately hold off a PFET coupled to a higher power supply voltage. In another case, a logic zero level from one domain may not adequately hold off an NFET coupled to a higher ground potential. Prior art techniques have distributed multiple power levels to such domains causing crowded wiring channels and increased circuit complexity.

There is, therefore, a need for a header and footer circuit design methodology as well a cell based virtual rail cells that make it simpler to implement power-gating of logic systems and sub-systems while providing a simple method of level shifting that has low latency and provides lower leakage, less wiring channel overhead and higher reliability.

SUMMARY OF THE INVENTION

The power-gating circuit used to selectively couple the positive supply voltage to and from selected logic gates is referred to as "a header circuit" and power-gating circuit used to selectively couple the ground supply voltage to and from selected logic gates is referred to as "a footer circuit." In embodiments of the present invention, the header and footer circuits are configured into cells that contain both the control circuitry and the switch device(s) used to actually couple the power supply voltage potential from the corresponding power supply rail to the power-gated logic. The cells are configured with a control input, a node coupled to a power supply voltage potential, a node for coupling to selective power-gated logic, and an output for propagating the control to another cell. The power domains may have differing power supply potentials wherein control signals from a low voltage power domain are coupled to a power domain with a higher power supply potential. The control circuitry accomplishes the level shifting in one stage and has complementary circuits; one where the positive potential of a power gated domain is the higher than the power supply of the control signals domain and one where the ground potential of the control signal domain is higher that the ground potential of a power gated domain.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A is a circuit block diagram illustrating a virtual positive voltage rail cell suitable for practicing embodiments of the present invention;

FIG. 3B is a circuit block diagram illustrating cascading two virtual positive voltage rail cells suitable for practicing embodiments of the present invention;

FIG. 5A is a circuit block diagram illustrating another virtual ground rail cell suitable for practicing embodiments of the present invention;

FIG. 5B is a circuit block diagram illustrating cascading two virtual ground voltage rail cells suitable for practicing embodiments of the present invention;

FIG. 6A is a circuit block diagram illustrating another virtual positive voltage rail cell suitable for practicing embodiments of the present invention;

FIG. 6B is a circuit block diagram illustrating cascading two virtual positive voltage rail cells suitable for practicing embodiments of the present invention;

DETAILED DESCRIPTION

Figure 1:
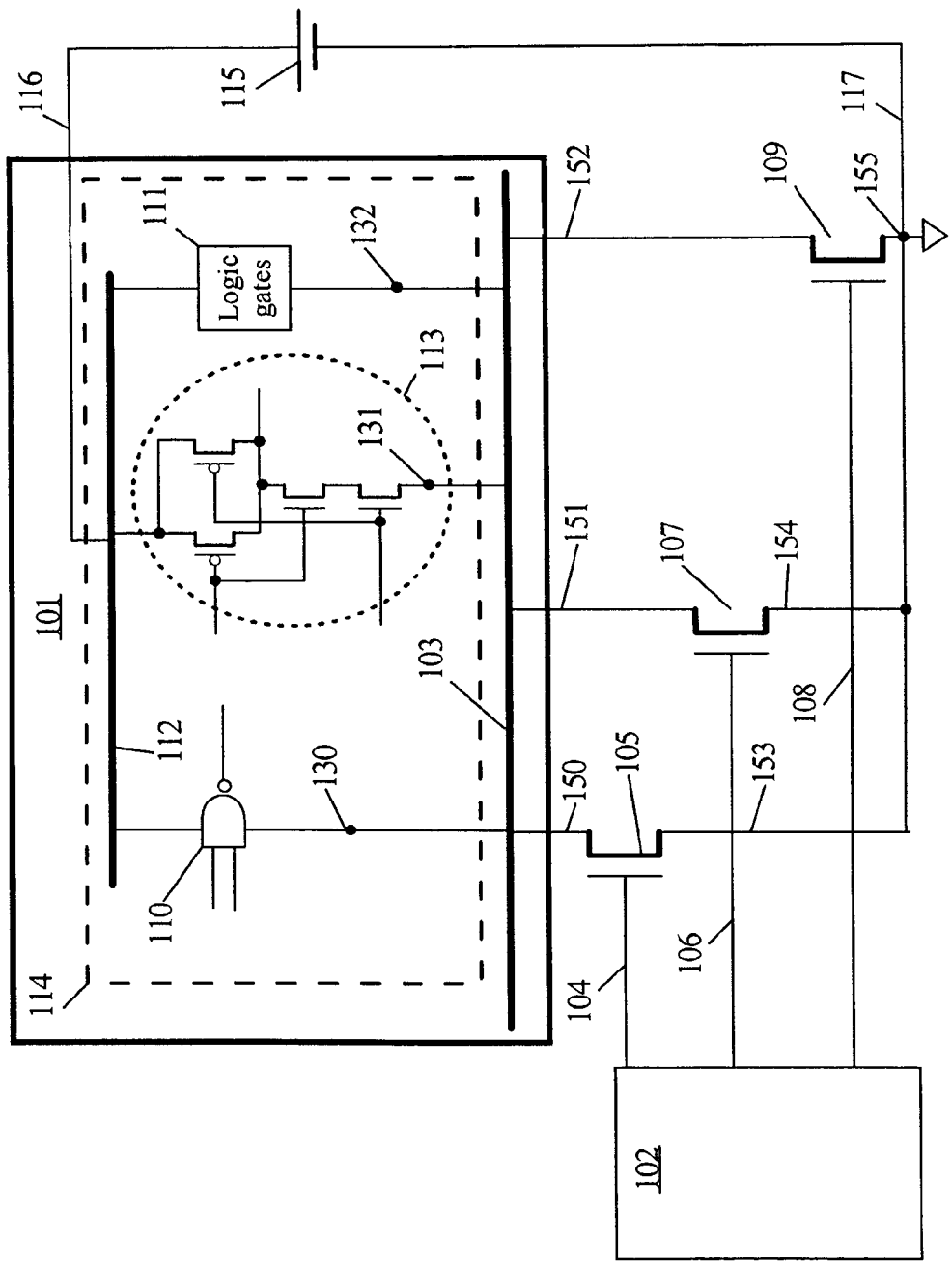
FIG. 1 is a circuit block diagram illustrating a basic topology of embodiments of the present invention for power-gating a virtual ground rail.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

In the following, power supply voltage potentials are distributed to circuits on circuit traces or printed wires which may be referred to interchangeably as power supply rails, grids or buses. Power supply voltage potentials are coupled to the buses or grids to activate various logic circuitry. The power supply voltage potentials may be referred to simply as positive potential or ground potential. The "voltage" term may be dropped for simplicity with the understanding that all the potentials are voltage potentials. Embodiments of the present invention employ power-gating circuitry to configure cells for generating virtual power supply rails where the switching devices for coupling and decoupling the virtual power supply rails from the power supply potentials are integrated with the control logic devices for driving the switching devices. These may be referred to as power-gating cells or virtual rail cells.

Refer now to the drawings wherein depicted elements are not necessarily shown to scale and wherein like or similar elements are designated by the same reference numeral through the several views.

FIG. 1 is a block circuit diagram of power-gating according to embodiments of the present invention. A logic circuit domain 101 has a virtual low (ground) power supply rail or bus (VGR) 103 that is coupled to the ground nodes 130–132 of selected circuits 110, 111, and 113 in domain 101. Logic circuit 113 illustrates the FETs making up its logic function. Power supply 115 has positive voltage potential 116 coupled directly to bus 112 and ground voltage potential 117. The VGR 103 is selectively coupled to the power supply ground voltage potential 117 with parallel N channel field effect transistor (NFET) devices 105, 107, and 109 operating as electronic switches. NFETs 105, 107, and 109 have nodes 150–152, respectively, coupled to VGR 103 and nodes 153–154, respectively, coupled to ground voltage potential 117. The NFETs 105, 107, and 109 are controlled by logic signals 104, 106, and 108, respectively. Logic signals 104, 106, and 108 are generated in logic domain 102 with non power-gated circuitry. In this manner, VGR 103 may be coupled to ground potential 117 with various degrees of conductivity. Large devices have higher conductivity but generally display higher leakage. Smaller devices have lower conductivity but display lower leakage. In this manner, some or all of NFETs 105, 107, and 109 may be gated ON when there is a high degree of switching in domain 101 requiring speed in arriving at a logic output in response to logic inputs. Once an output is determined in domain 101, selective ones of NFETs 105, 107, and 109 may be gated OFF thus reducing leakage power.

Figure 2:
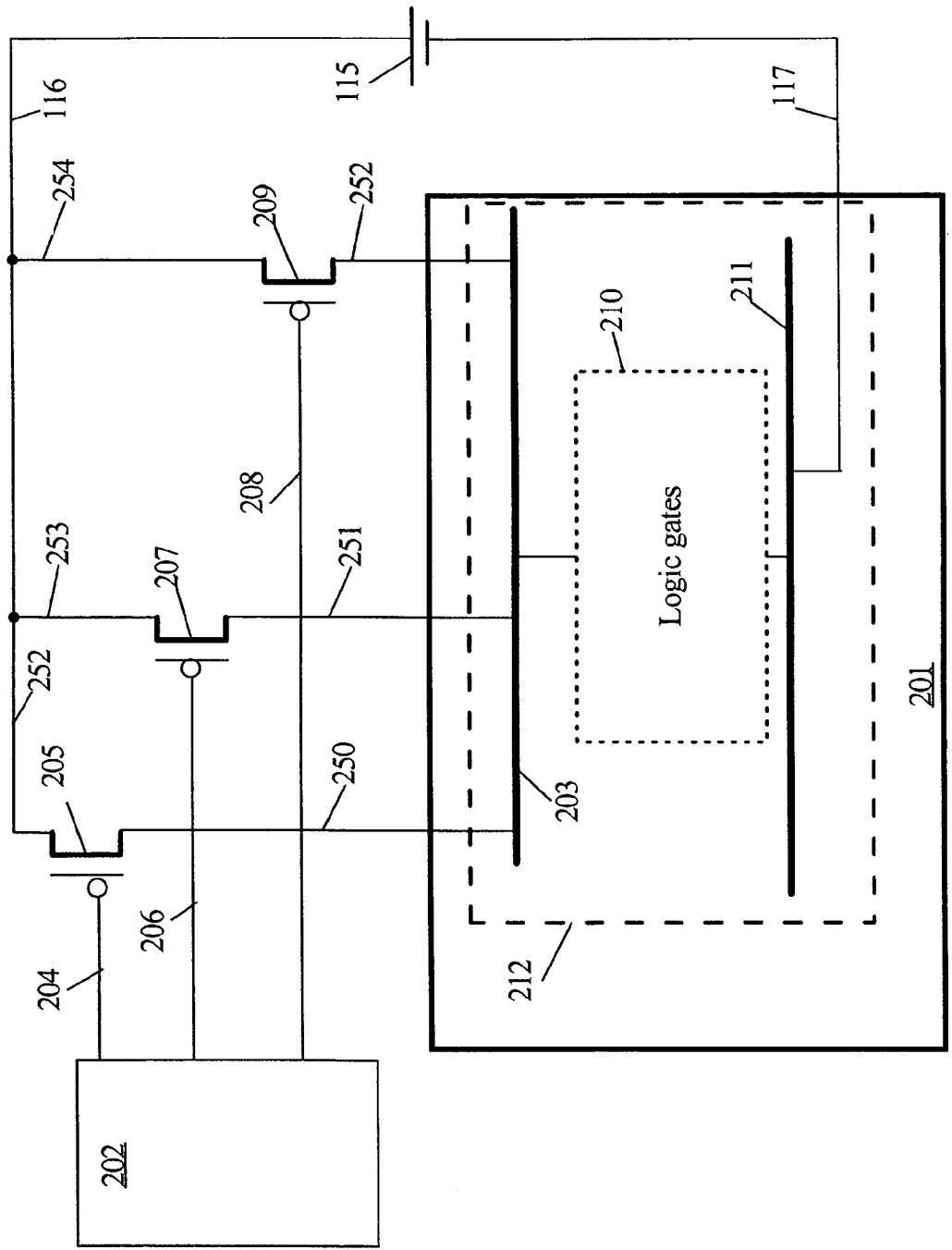
FIG. 2 is a circuit block diagram illustrating a basic topology of embodiments of the present invention for power-gating a virtual positive voltage rail.

FIG. 2 is a block circuit diagram of power-gating according to embodiments of the present invention. A logic circuit domain 201 has a virtual high (positive) power supply rail or bus (VPR) 203 that is coupled to a positive power bus in selected circuits 210. Power bus 211 of logic gates 210 is coupled directly to ground potential 117 of power supply 115. VPR 203 is coupled to the positive potential 116 of power supply with parallel P channel field effect transistor (PFET) devices 205, 207, and 209 operating as electronic switches. PFETs 205, 207, and 209 have nodes 252–254, respectively, coupled to positive voltage potential 116 and nodes 250–251, respectively, coupled to VPR 203. The PFETs 205, 207, and 209 are gated by logic signals 204, 206, and 208, respectively. Logic signals 204, 206, and 208 are generated in logic domain 202 with non-power-gated circuitry. In this manner, VPR 203 may be coupled to the positive potential 116 with various degrees of conductivity. Large devices have higher conductivity but display higher leakage. Smaller devices have lower conductivity but display lower leakage. Some or all of PFETs 205, 207, and 209 may be gated ON when there is a high degree of switching in domain 201 requiring speed in arriving at a logic output in response to logic inputs. Once an output is determined in domain 201, selective ones of PFETs 205, 207, and 209 may be gated OFF thus reducing leakage power.

FIGS. 1 and 2 show partitioned power-gating applied to only one power supply potential at a time, however, it is understood that embodiments of the present invention may employ partitioned power-gating simultaneously to both power supply potentials for logic circuits in a logic domain (e.g., domain 201).

The following FIGS. 3–12 may show embodiments of the present invention applied to one power supply bus at a time for simplicity. Likewise, NFETs and PFETs are used as electronic switches to couple power supply potentials to virtual power buses. These NFETs and PFETs have nodes that may not have specific designators as used in FIGS. 1 and 2 to simplify drawings.

FIG. 3A is a circuit diagram of a virtual positive voltage rail cell (VPRC) 301 suitable for practicing embodiments of the present invention. VPRC 301 has a power-gating block (PGB) 307 and non-power-gated inverters 302 and 303. VPRC 301 has a Vdd control input 309 coupled to logic inverter 302. Logic inverter 302 is coupled to logic inverter 303 an generates positive voltage potential (Vdd) control output 310 which is also coupled to the gates of PFETs 304–306. PFETs 304–306 are the devices that couple and decouple the positive voltage potential (Vdd) 311 to the virtual positive voltage rail node (VPR) 308 in response to logic states on Vdd control output 310. PFETs 304–306 form PGB 307. Typically a PGB is made up of two or more small transistor devices in parallel that act as one large device relative to their conductivity, however, the gates of these devices may be coupled over a wiring length wherein there is a delay from when PFET 304, PFET 304, and PFET 306 turn ON and OFF. While only three devices are shown in PGB 307, in general, PGB 307 may have many devices depending on the how much logic circuitry is power-gated with VPR 308. Three devices are shown only to simplify the circuit diagrams. Vdd control output 310 extends from VPRC 301 so that multiple VPRCs may be cascaded to form multiple VPR nodes as is shown in FIG. 3B. This cell based power-gating used in embodiments of the present invention effectively eliminates the drive delay penalty due to long wires required to couple control signals in a non-cell based approach to power-gating.

FIG. 3B illustrates a VPRC 320 cascaded with a VPRC 321. Vdd control input 324 is coupled to non-power-gated logic inverters 302 and 303 which in turn drive the gates of the PFETs in PGB 307. The Vdd control output of VPRC 320 and the Vdd control input of VPRC 321 are coupled at node 323. In this manner Vdd control input 324 and Vdd control output 325 have the same steady state phase but there is a delay time period for a transition on Vdd control input 324 to propagate through the logic inverters (302, 303, 332, and 333) and the PGBs (307 and 337) in VPRC 320 and 321. The VPR 326 and VPR 327 nodes may be segmented or they may be coupled together as illustrated by dotted line 322. When Vdd control input 324 transitions to a logic zero the PFETs (e.g., 304–306) in PGB 307 in VPRC 320 turn ON first in delay sequence. When the transition to a logic zero propagates through to PGB 337 in VPRC 321, then the VPR 327 node in VPRC 321 is also coupled to Vdd 311 by PGB 337 but a delay time period following the turn ON of the PFETs in PGB 307 in VPRC 320. In this manner, a designer may time the "sleep" and "wake-up" of a VPR node powering logic devices by selecting which VPR (e.g., 326 or 327) in a sequence of VPRCs is selected for power-gating selected logic circuitry.

Figure 4A:
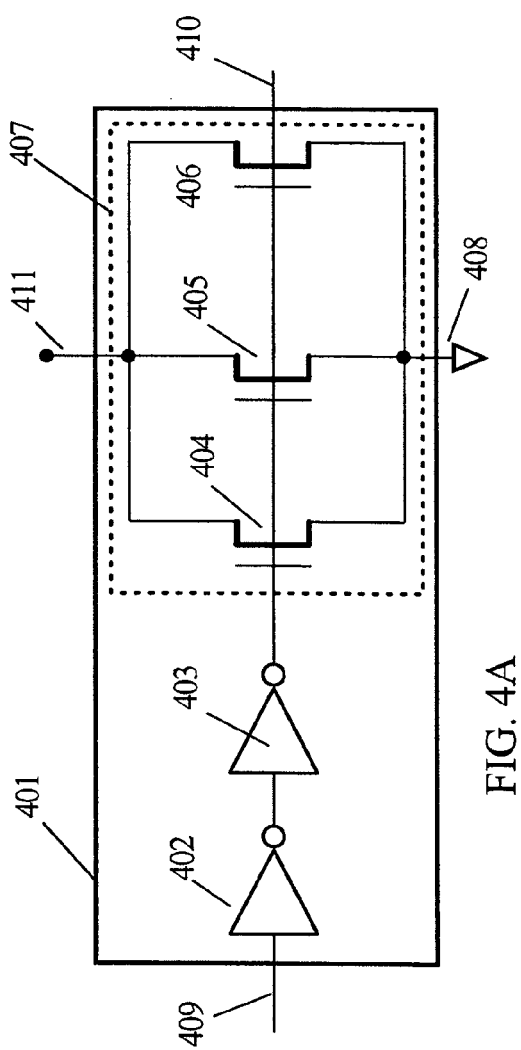
FIG. 4A is a circuit block diagram illustrating a virtual ground rail cell suitable for practicing embodiments of the present invention.

FIG. 4A is a circuit diagram of a virtual ground voltage rail cell (VGRC) 401 suitable for practicing embodiments of the present invention. VGRC 401 has a power-gating block (PGB) 407 and non-power-gated inverters 402 and 403. VGRC 401 has a Vgnd control input 409 coupled to logic inverter 402. Logic inverter 402 is coupled to logic inverter 403 an generates ground voltage potential (Vgnd) control output 410 which is also coupled to the gates of NFETs 404–406. NFETs 404–406 are the devices that couple and decouple the ground voltage potential (Vgnd) 411 to the virtual ground voltage rail node (VGR) 408 in response to logic states on Vgnd control output 410. NFETs 404–406 form PGB 407. Typically a PGB is made up of two or more small transistor devices in parallel that act as one large device relative to their conductivity, however, the gates of these devices may be coupled over a wiring length wherein there is a delay from when NFET 404, NFET 404, and NFET 406 turn ON and OFF. While only three devices are shown in PGB 407, in general, PGB 407 may have many devices depending on the how much logic circuitry is power-gated with VGR 408. Three devices are shown only to simplify the circuit diagrams. Vgnd control output 410 extends from VGRC 401 so that multiple VGRCs may be cascaded to form multiple VGR nodes as is shown in FIG. 4B.

Figure 4B:
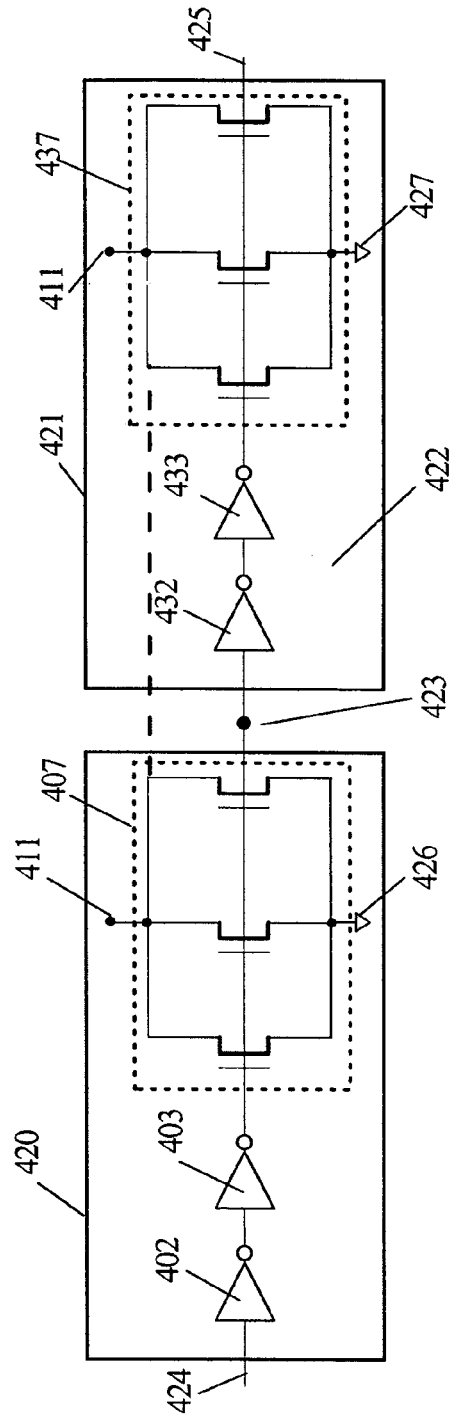
FIG. 4B is a circuit block diagram illustrating cascading two virtual ground voltage rail cells suitable for practicing embodiments of the present invention.

FIG. 4B illustrates a VGRC 420 cascaded with a VGRC 421. Vgnd control input 424 is coupled to non-power-gated logic inverters 402 and 403 which in turn drive the gates of the NFETs in PGB 407. The Vgnd control output of VGRC 420 and the Vgnd control input of VGRC 421 are coupled at node 423. In this manner Vgnd control input 424 and Vgnd control output 425 have the same steady state phase but there is a delay time period for a transition on Vgnd control input 424 to propagate through the logic inverters (402 and 403) and PGB 407 and 437 in both VGRC 420 and 421 respectively. Nodes VGR 426 and VGR 427 may be segmented or they may be coupled together as illustrated by dotted line 422. When Vgnd control input 424 transitions to a logic zero the NFETs (e.g., 404–406) in PGB 407 in VGRC 420 turn ON first in delay sequence. When the transition to a logic zero propagates through to PGB 437 in VGRC 421, then VGR 427 node in VGRC 421 is also coupled to Vgnd 411 by PGB 437 but a delay time period following the turn ON of the NFETs (e.g., 404–406) of PGB 407 in VGRC 420. In this manner, a designer may time the "sleep" and "wake-up" of a VGR node powering logic devices by selecting which VGR (e.g., 426 or 427) in a sequence of VGRCs is selected for power-gating selected logic circuitry.

FIG. 5A is a circuit diagram of another virtual ground voltage rail cell (VGRC) 501 suitable for practicing embodiments of the present invention. VGRC 501 has a power-gating block (PGB) 507 and non-power-gated inverters 502 and 503. Inverters 502 and 503 are not coupled directly in series as was the case in VGRC 420 in FIG. 4A. VGRC 501 has a Vgnd control input 509 coupled to logic inverter 502. Logic inverter 502 is coupled to the gates of NFETs 504–506 and then to logic inverter 503 which generates Vgnd control output 510. NFETs 504–506 are the devices that couple and decouple Vgnd 511 to the virtual ground voltage rail node (VGR) 508 in response to logic states on Vgnd control output 510. NFETs 504–506 form PGB 501. In this embodiment, a logic one turns ON the NFET devices in PGB 507 as Vgnd control input 509 has only one logic inversion before it is coupled to the NFETs in PGB 507. Again Vgnd control output 510 extends from VGRC 501 so that multiple VGRCs may be cascaded to form multiple VGR nodes as is shown in FIG. 5B.

FIG. 5B illustrates a VGRC 520 cascaded with a VGRC 521 according to the embodiment of VGRC 501 of FIG. 5A. Vgnd control input 524 is coupled to non-power-gated logic inverter 502 and its output in turn drives the gates of the NFETs in PGB 507. The gates of the NFETs in PGB 507 are also coupled to the input of non-power-gated inverter 503 which converts the Vgnd control output of VGRC 520 to the same steady state phase as Vgnd control input 524. The Vgnd control output of VGRC 520 and the Vgnd control input of VGRC 521 are coupled at node 523. In this manner Vgnd control input 524 and Vgnd control output 525 have the same steady state phase but again there is a delay time period for a transition on Vgnd control input 524 to propagate through the logic inverters (502 and 503) and PGB 507 and 537 in both VGRC 520 and 521 respectively. Nodes VGR 526 and VGR 527 may be segmented or they may be coupled together as illustrated by dotted line 522. When Vgnd control input 524 transitions to a logic zero the NFETs (e.g., 504–506) in PGB 507 in VGRC 520 turn ON first in delay sequence. When the transition to a logic zero propagates as a logic one to PGB 537 in VGRC 521, then VGR 527 is also coupled to Vgnd 511 by PGB 537 but a delay time period following the turn ON of the NFETs (e.g., 504–506) of PGB 507 in VGRC 520. In this manner, a designer may time the "sleep" and "wake-up" of a VGR node powering logic devices by selecting which VGR (e.g., 526 or 527) in a sequence of VGRCs is selected for power-gating selected logic circuitry.

FIG. 6A is a circuit diagram of another virtual positive voltage rail cell (VPRC) 601 suitable for practicing embodiments of the present invention. VPRC 601 has a power-gating block (PGB) 607 and non-power-gated inverters 602 and 603. Inverters 602 and 603 are not coupled directly in series as was the case in VPRC 420 in FIG. 4A. VPRC 601 has a Vdd control input 609 coupled to logic inverter 602. Logic inverter 602 is coupled to the gates of PFETs 604–606 and then to logic inverter 603 which generates Vdd control output 610. PFETs 604–606 are the devices that couple and decouple Vdd 611 to the virtual ground voltage rail node (VPR) 608 in response to logic states on Vdd control output 610. PFETs 604–606 form PGB 601. In this embodiment, a logic one turns ON the PFET devices in PGB 607 as Vdd control input 609 has only one logic inversion before it is coupled to the PFETs in PGB 607. Again Vdd control output 610 extends from VPRC 601 so that multiple VPRCs may be cascaded to form multiple VPR nodes as is shown in FIG. 6B.

FIG. 6B illustrates a VPRC 620 cascaded with a VPRC 621 according to the embodiment of VPRC 601 of FIG. 6A. Vdd control input 624 is coupled to non-power-gated logic inverter 602 and its output in turn drives the gates of the PFETs in PGB 607. The gates of the PFETs in PGB 607 are also coupled to the input of non-power-gated inverter 603 which converts the Vdd control output of VPRC 620 to the same steady state phase as Vdd control input 624. The Vdd control output of VPRC 620 and the Vdd control input of VPRC 621 are coupled at node 623. In this manner Vdd control input 624 and Vdd control output 625 have the same steady state phase but again there is a delay time period for a transition on Vdd control input 624 to propagate through the logic inverters (602 and 603) and PGB 607 and 637 in both VPRC 620 and 621 respectively. Nodes VPR 626 and VPR 627 may be segmented or they may be coupled together as illustrated by dotted line 622. When Vdd control input 624 transitions to a logic zero the PFETs (e.g., 604–606) in PGB 607 in VPRC 620 turn ON first in delay sequence. When the transition to a logic zero propagates as a logic one to PGB 637 in VPRC 621, then VPR 627 is also coupled to Vdd 611 by PGB 637 but a delay time period following the turn ON of the PFETs (e.g., 604–606) of PGB 607 in VPRC 620. In this manner, a designer may time the "sleep" and "wake-up" of a VPR node powering logic devices by selecting which VPR (e.g., 626 or 627) in a sequence of VPRCs is selected for power-gating selected logic circuitry.

Figure 7A:
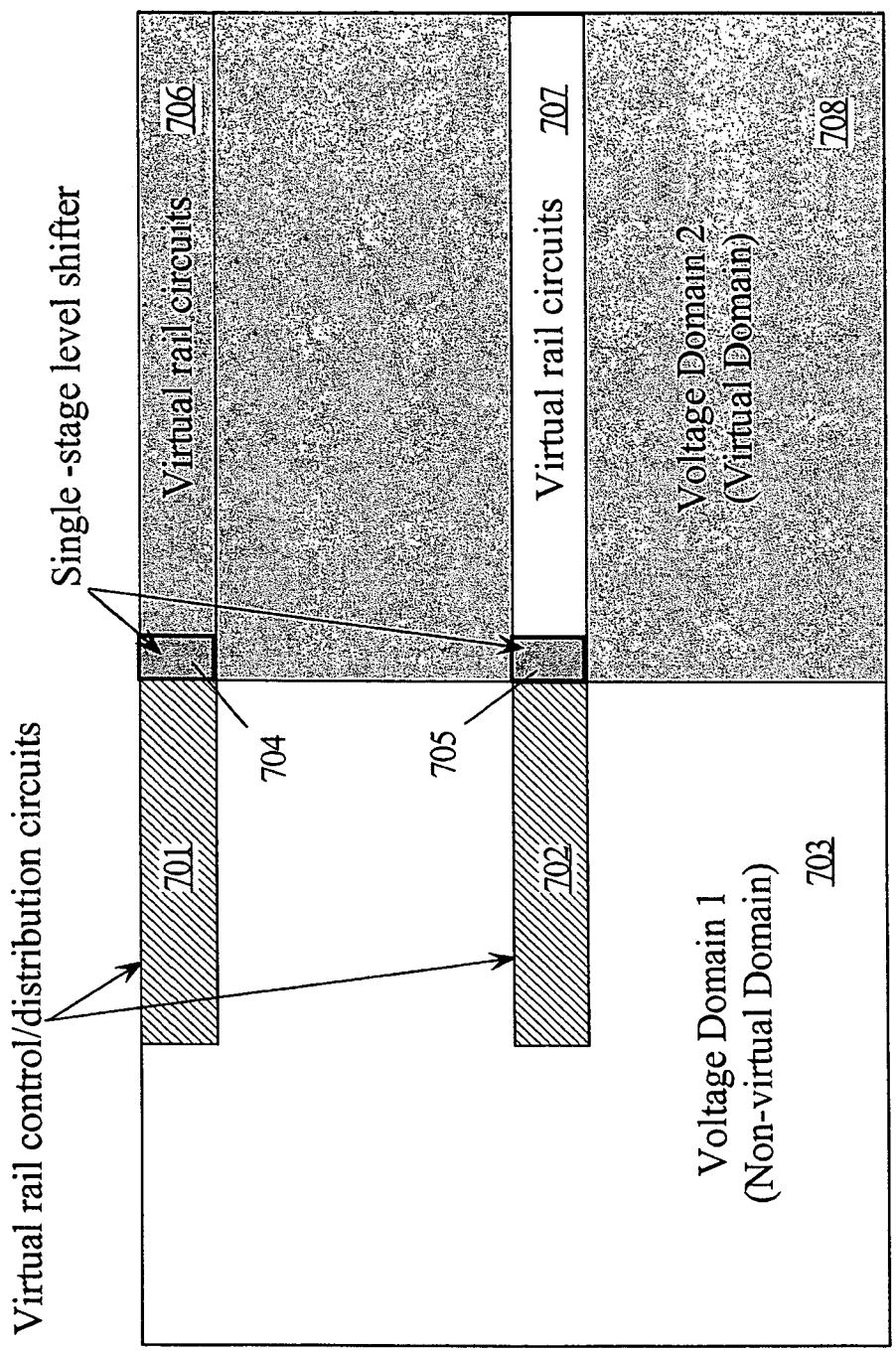
FIG. 7A is a circuit block diagram illustrating interfacing non-virtual domains with a virtual domain having a higher voltage potential according to embodiments of the present invention.

FIG. 7A is a block diagram illustrating interfaces between non-virtual and virtual voltage domains according to embodiments of the present invention. Voltage domain 703 is non-virtual meaning it does not employ power-gating. The virtual rail control and distribution circuits 701 and 702 reside in voltage domain 703 and must interface with voltage domain 708 which operates at a different, higher voltage level. To assure a robust interface, a single-stage level shifter 704 interfaces the control circuitry 701 to virtual rail circuits 706 which operate at a higher voltage level in voltage domain 708. Likewise, single-stage level shifter 705 interfaces the control circuitry 702 to virtual rail circuits 707 which also operate at the higher voltage level.

Figure 7B:
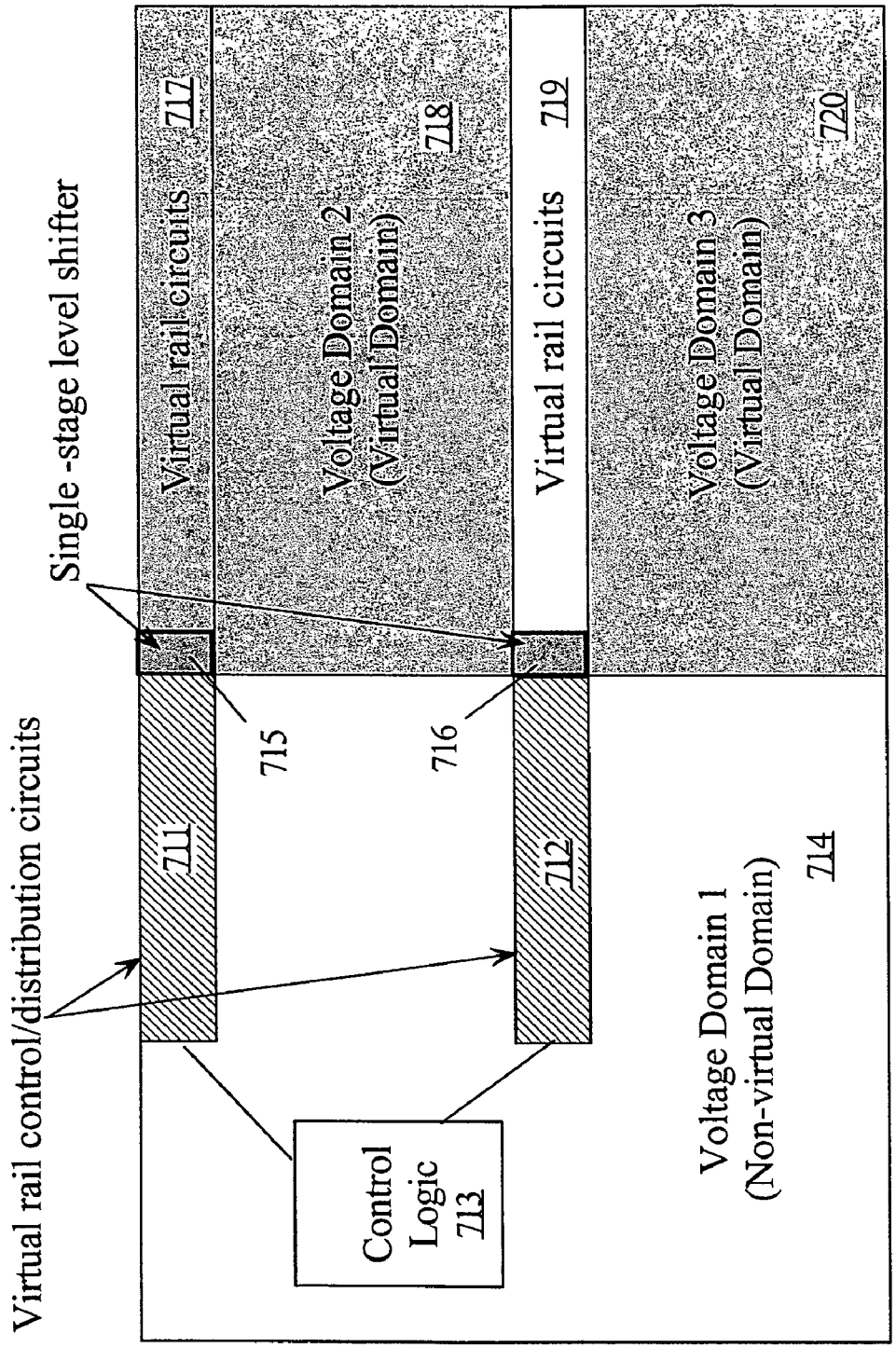
FIG. 7B; is a circuit block diagram illustrating interfacing non-virtual domains with two virtual domains having a different voltage potential according to embodiments of the present invention

FIG. 7B is a block diagram illustrating interfaces between non-virtual and virtual voltage domains according to embodiments of the present invention. Voltage domain 714 is non-virtual meaning it does not employ power-gating. The virtual rail control and distribution circuits 711 and 712 reside in voltage domain 714 and must interface with voltage domains 718 and 720 each of which operates at a different higher voltage level. To assure a robust interface, again a single-stage level shifter 715, according to embodiments of the present invention, interfaces the control circuitry 711 to virtual rail circuits 717 which operate at a higher voltage level in voltage domain 718. Likewise, a single-stage level shifter 716 interfaces the control circuitry 712 to virtual rail circuits 719 which also operate at a different higher voltage level. Control logic 713 operates in voltage domain 714 and supplies signals for control circuits 711 and 712.

Figure 7C:
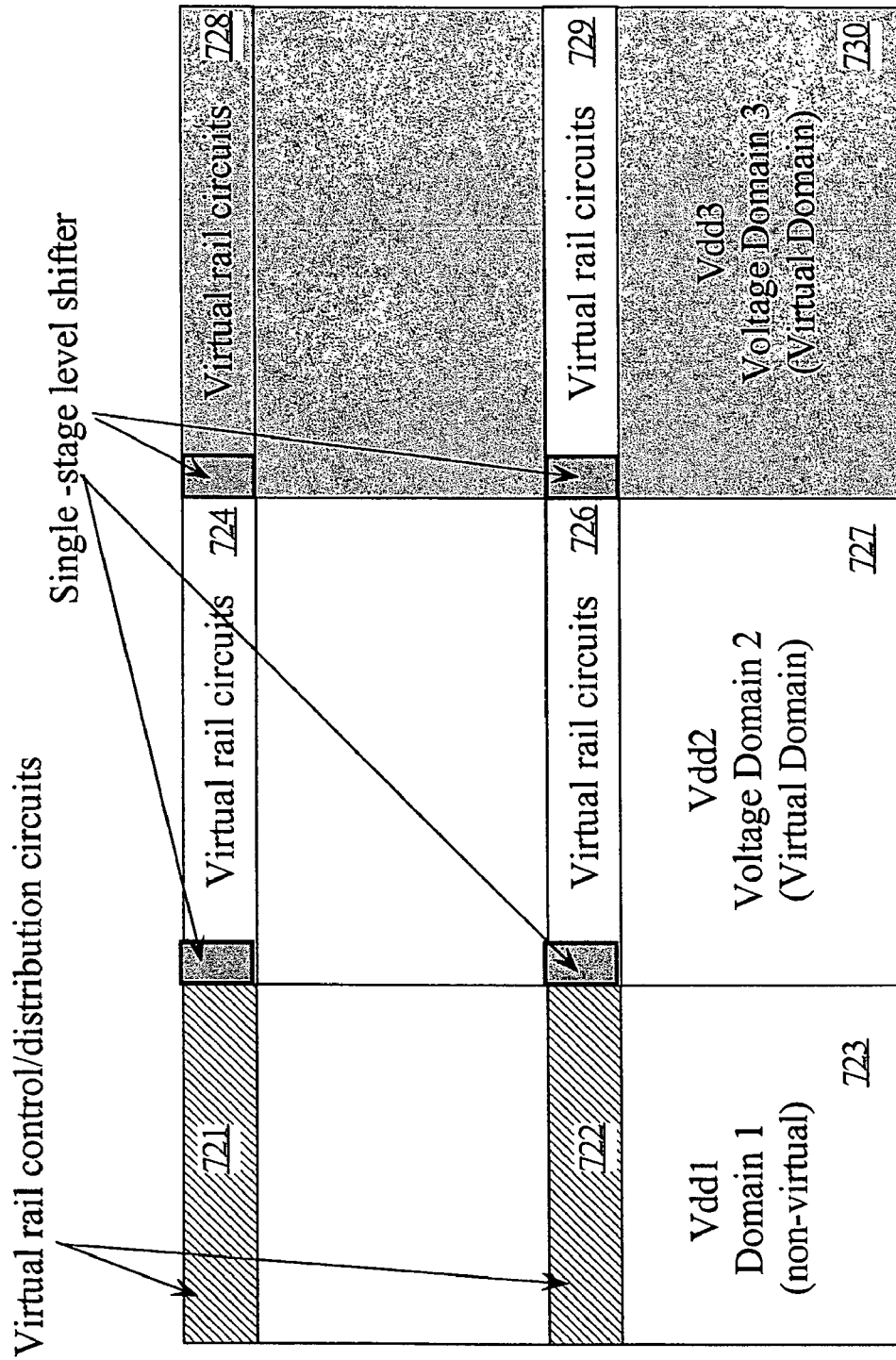
FIG. 7C is a circuit block diagram illustrating interfacing non-virtual domains with sequential virtual domains having a different voltage potential according to embodiments of the present invention.

FIG. 7C is a block diagram of sequential interfaces between three voltage domains, voltage domain 723, 727 and 730. In this example virtual rail control/distribution circuits 721 and 722 are in voltage domain 723 and interface with voltage domain 727 using single-stage level shifters 731 and 732 according to embodiments of the present invention. Voltage domain 727 passes these control signals to voltage domain 730 again using single-stage level shifters 733 and 734 according to embodiments of the present invention. In this embodiment, rail voltages Vdd 1 of voltage domain 723 is less than Vdd 2 of voltage domain 727 which is less than Vdd 3 of voltage domain 730.

Figure 8:
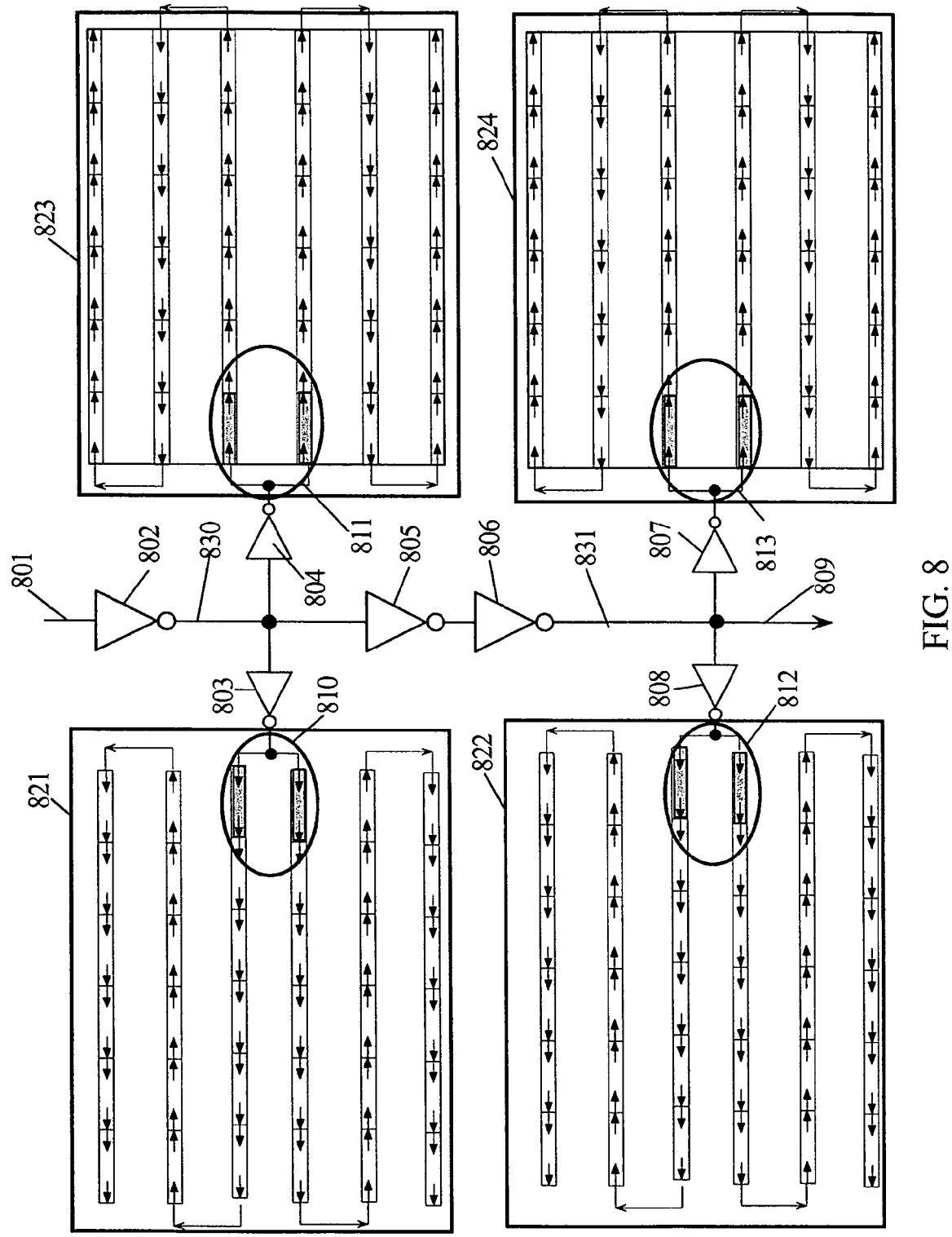
FIG. 8 is a circuit block diagram illustrating distributing control signals to a plurality of power grids according to embodiments of the present invention.

FIG. 8 is a diagram illustrating a gated power grid 800 of power-gated cells generating virtual rail nodes (not shown) according to embodiments of the present invention. The arrows indicates the direction of control signal flow. Non-power-gated inverter 802 generates a control input 830 from a control input 801. Control input 810 drives two parallel control chains wherein the heads of the chains (810) employ single-stage level shifters where the voltage level of voltage domain 821 is higher than the control circuits (e.g., inverter 803). Control signal 830 is further distributed via inverters 804–808 to voltage domains 822–824 using single-stage level shifters 811–813 according to embodiments of the present invention.

Figure 9:
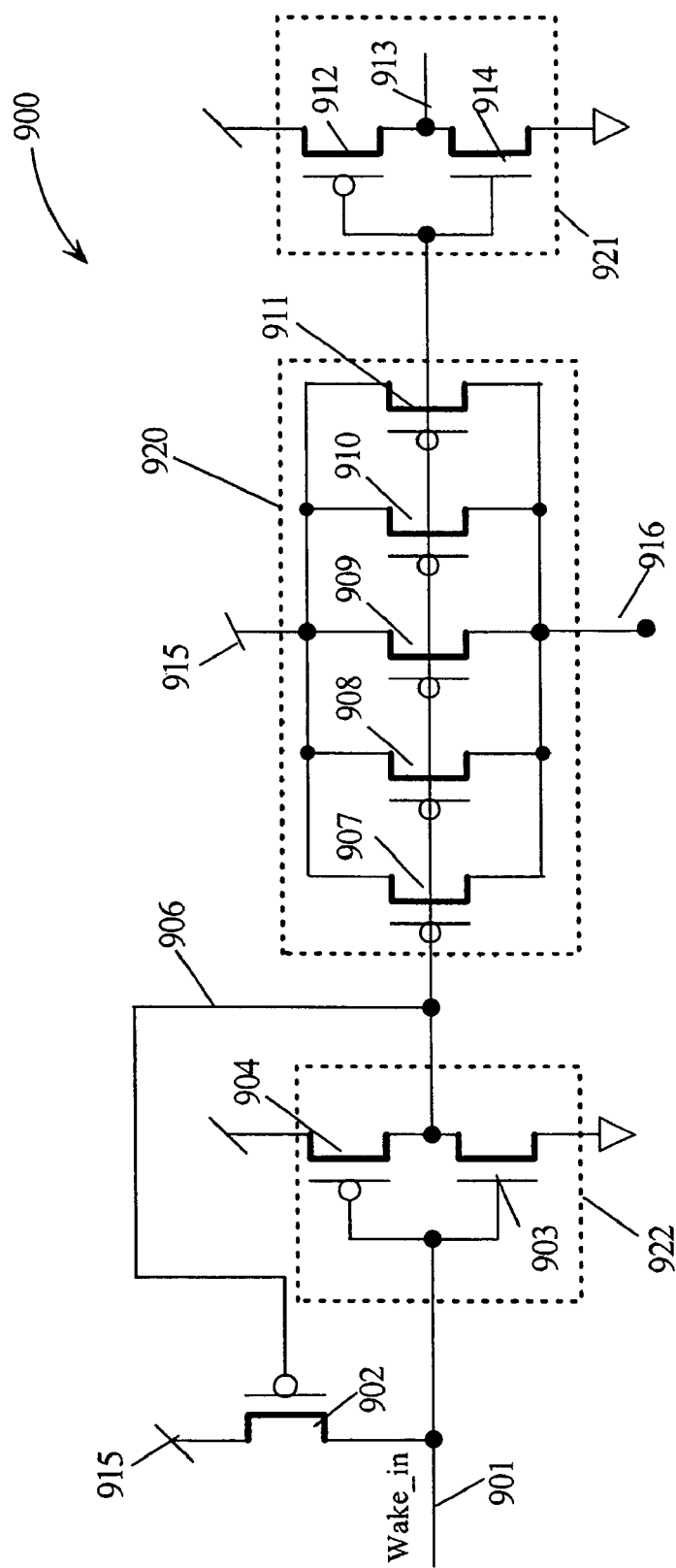
FIG. 9 is a prior art circuit block diagram illustrating interfacing circuitry between power domains with the same power supply voltages.

FIG. 9 is a circuit diagram of a VPRC used in the prior art to couple control signals to a power-gated domain. In this example, the control domain and the power-gated domain are at the same voltage level. Vdd control input 901 is buffered with inverter 922 comprising PFET 904 and NFET 903. The output of inverter 922 drives at the input of PGB 920 comprising parallel coupled PFETs 907–910. The output of PGB 920 is coupled to buffer inverter 921 comprising PFET 912 and NFET 914 which generates Vdd control output 913. The PFETs (907–911) are turned ON in delay sequence when node 906 transitions to a logic zero in response to a logic one transition on Vdd control input 901. When node 906 transitions to a logic zero keeper PFET 902 turns ON and enhances the drive of the logic one at Vdd control input 901. This latching functions allows a logic one pulse signal arriving at Vdd control input to latch ON PGB 920 coupling Vdd 915 to VPRC node 916.

Figure 10:
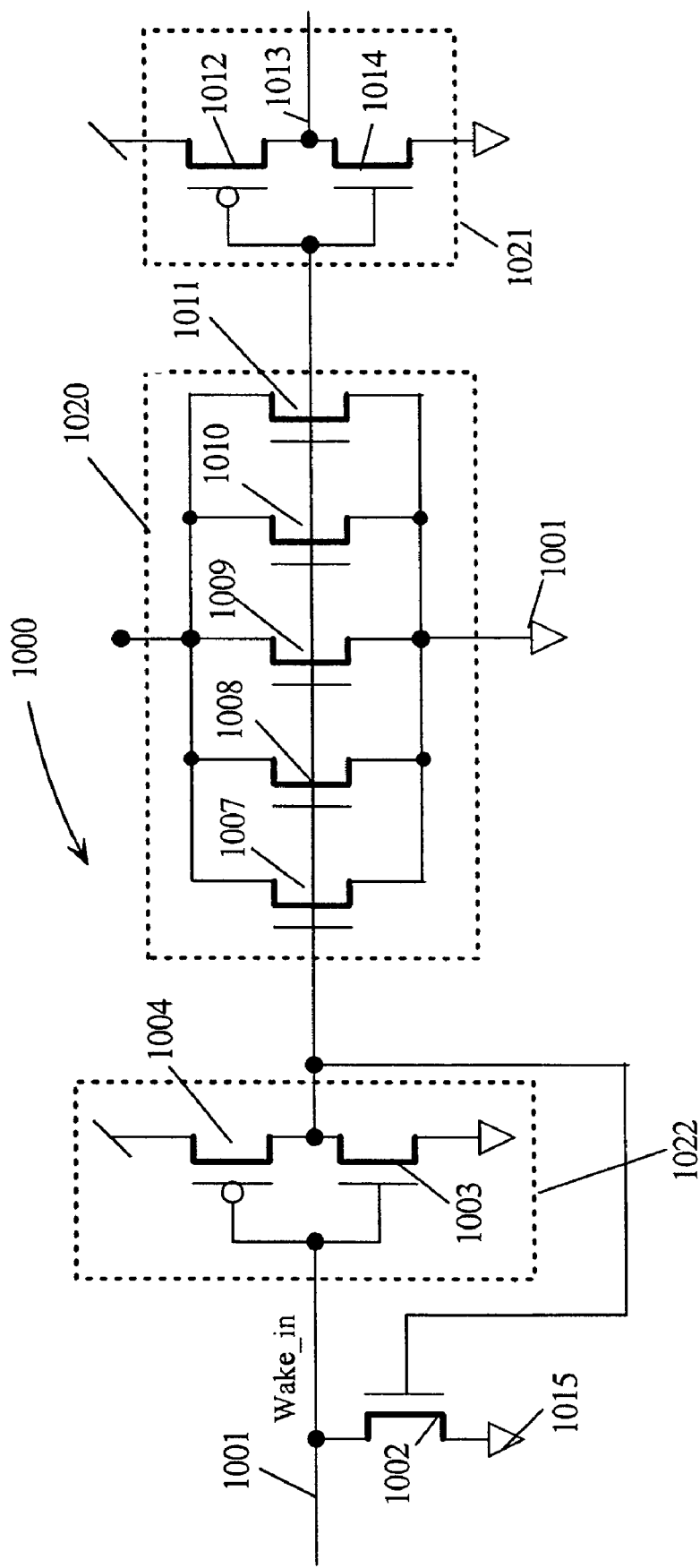
FIG. 10 is another prior art circuit block diagram illustrating interfacing circuitry between power domains with the same power supply voltages.

FIG. 10 is a circuit diagram of a VGRC used in the prior art to couple control signals to a power-gated domain. Vgnd control input 1001 is buffered with inverter 1022 comprising PFET 1004 and NFET 1003. The output of inverter 1022 drives the input of PGB 1020 comprising parallel coupled PFETs 1007–1010. The output of PGB 1020 is coupled to buffer inverter 1021 comprising PFET 1012 and NFET 1014 which generates Vgnd control output 1013. The PFETs (1007–1010) are turned ON in delay sequence when node 1006 transitions to a logic zero in response to a logic one transition on Vgnd control input 1001. When node 1006 transitions to a logic zero keeper NFET 1002 turns ON and enhances the drive of the logic one at Vgnd control input 1001. This latching functions allows a logic one pulse signal arriving at Vgnd control input to latch ON PGB 1020 coupling Vgnd 1015 to VGR node 1016.

Figure 11:
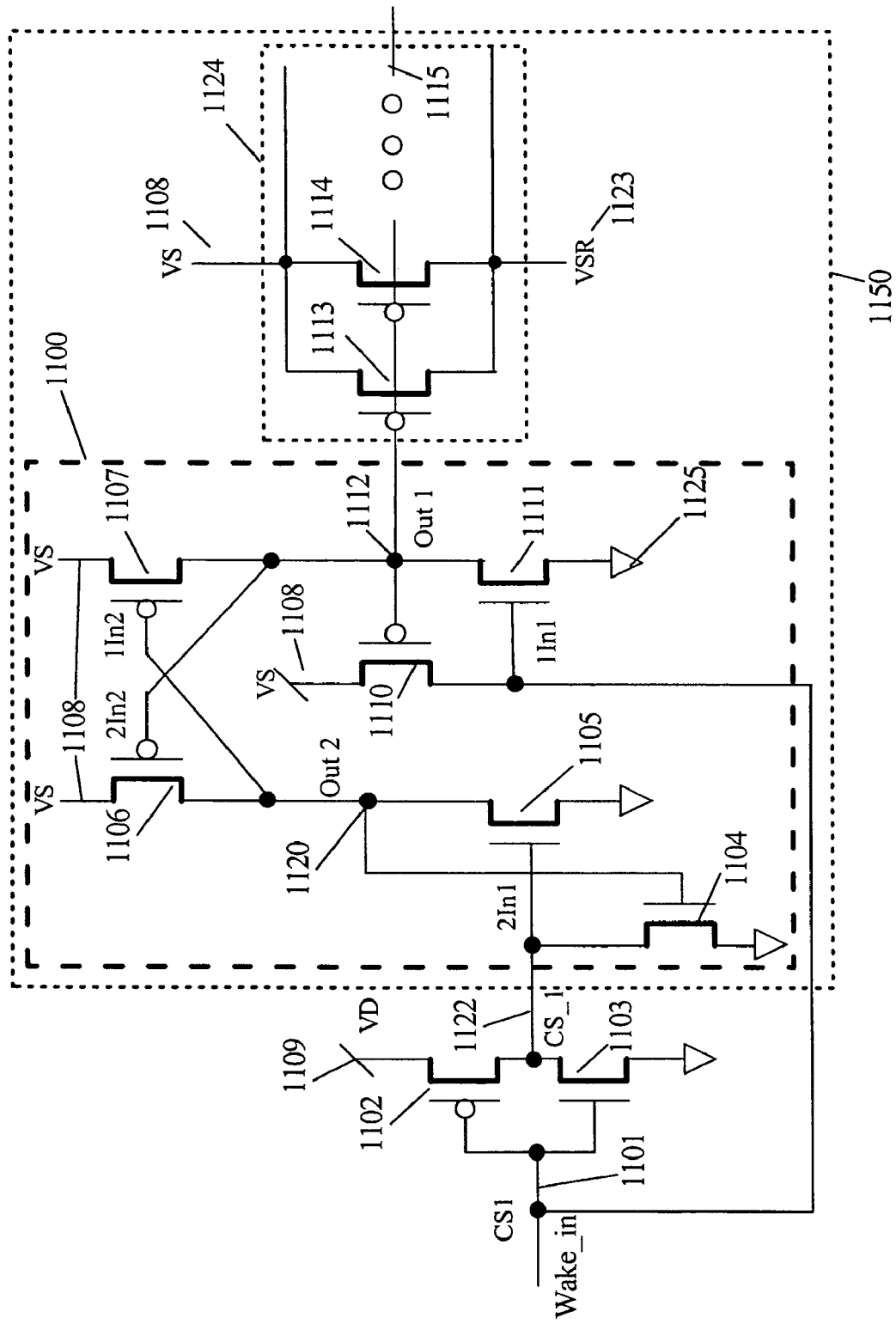
FIG. 11 is a circuit diagram of a single stage level shifting circuit according to one embodiment of the present invention for interfacing between power domains with different power supply voltage levels.

FIG. 11 is a single-stage level shifter (interface circuit) 1100 according to embodiment of the present invention for controlling power gating devices coupled to the positive power supply potential. A primary reason for providing level shifting is the difference in the positive power supply voltage potentials in the interfacing voltage domains or the negative or ground power supply voltage potentials. If a lower positive power supply potential (e.g., VD 1109) is relied upon to turn OFF a PFET (e.g., PFETS 1113 and 1114) with a source coupled to higher voltage (e.g., VS 1108), then significant leakage may occur.

Single-stage level shifter 1100 has a first circuit comprising PFET 1107 and NFET 1111. The first circuit has a first input 1In 1 (gate of NFET 1111), a second input 1In 2 (gate of PFET 1107) and an output Out 1 (node 1112). The first input 1In 1 is coupled to the first control signal CS1 1101 (Wake_in) which is generated in a first power domain (powered by VD 1109) which has voltage potentials that may differ from other power domains. Out 1 represent a second control signal in the second power domain 1150 (powered by VS 1108) which is generated by interface circuit 1100.

Interface circuit 1100 has a second circuit which has a first input 2In 1 (gate of NFET 1105), a second input 2In 2 (gate of PFET 1106) and an output Out 2 (node 1120). The first input 2In 1 is coupled to the complement of the first control signal CS_1 (1122) which is generated in a first power domain (powered by VD 1109).

Additionally, interface circuit 1100 has two keeper circuits comprising PFET 1110 which has an input coupled to Out 1 of the first circuit, a power node coupled to the power supply voltage potential VS 1108 in the second power domain 1150 and an output coupled back to the first input 1In 1 of the first circuit. In this embodiment the first power domain has a positive voltage potential VD 1109 and a ground potential VG 1125. The second power domain 1150 has a positive voltage potential VS 1108 and a ground voltage potential VG 1125. VS 1108 generates power-gated voltage VSR 1123 in response to the second control signal Out 1 at node 1112 which controls the exemplary PFET devices 1113 and 1114. In FIG. 11, PFETs 1113 and 1114 are parallel devices for power-gating block 1124 power supply voltage VS 1108. VS 1108 is coupled to virtual rail VSR 1123. VSR 1123 is powered when the circuits in the second power domain 1150 are activated by a logic one on Wake_in 1101 (CS 1).

PFET devices in power-gating block 1124 are activated when Wake-in 1101 transitions to a logic one and NFET 1111 is turned ON pulling output node 1112 to a logic zero. A logic zero at node 1112 activates power-gating block 1124 by turning ON exemplary PFETs 1113 and 1114. This logic zero state may be propagated by output 1115.

A logic one at Wake-in 1101 also turns ON NFET 1103 and turns OFF PFET 1102 which are powered by VD 1109 and ground 1125 in the first power or control domain. When NFET 1103 turns ON, node 1122 transitions to a logic zero turning OFF NFET 1105. With NFET 1111 turning ON and NFET 1105 turning OFF, PFET 1106 pulls node 1120 to a logic one turning OFF PFET 1107.

A logic zero at node 1112 turns ON keeper PFET 1110 and the logic one at Wake-in 1101 is re-enforced by VS 1108 holding NFET 1111 ON. Likewise, the logic one at node 1120 turns ON keeper NFET 1104 which re-enforces the logic zero at node 1122 holding NFET 1105 OFF. Since the activation logic zero state at node 1112 is the preferred logic state, both NFET keeper 1104 and PFET keeper 1110 acts to re-enforce the logic zero state at node 1112. The interface circuit of FIG. 11 assures the activation logic zero state at node 1112 is held by the keeper devices as well as assuring that the PFET devices (e.g., 1113 and 1114) in power-gating block 1124

Figure 12:
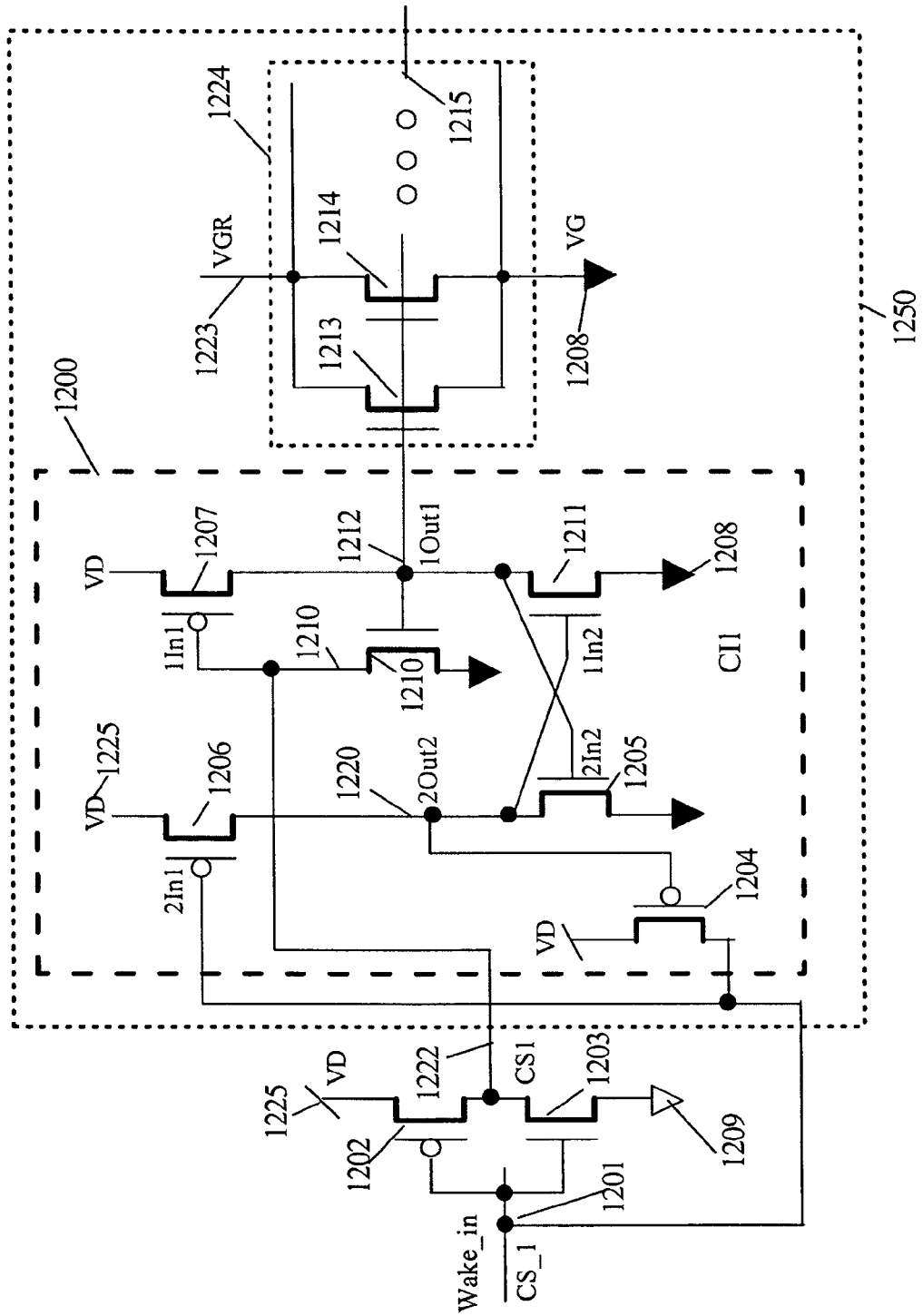
FIG. 12 is a circuit diagram of a single stage level shifting circuit according to another embodiment of the present invention for interfacing between power domains with different power supply voltage levels.

FIG. 12 is a single-stage level shifter (interface circuit) 1200 according to embodiment of the present invention for controlling power gating devices coupled to the positive power supply potential. Another reason for providing level shifting is the difference in the ground power supply voltage potentials in the interfacing voltage. If the higher ground power supply potential is relied upon to turn OFF an NFET with a lower ground potential, then significant leakage may occur.

Single-stage level shifter 1200 has a first circuit comprising PFET 1207 and NFET 1211. The first circuit has a first input 1In 1 (gate of PFET 1207), a second input 1In 2 (gate of NFET 1211) and an output Out 1 (node 1212). The first input 1In 1 is coupled to the first control signal CS1 1222 which is generated in a first power domain (powered by VG 1209). Out 1 represent a second control signal in the second power domain 1150 (powered by VG 1208) which is generated by interface circuit 1200.

Interface circuit 1200 has a second circuit which has a first input 2In 1 (gate of PFET 1206), a second input 2In 2 (gate of NFET 1205) and an output Out 2 (node 1220). The first input 2In 1 is coupled to the complement of the first control signal CS_1 1201 (Wake_in) which is generated in a first power domain (powered by VG 1209).

Additionally, interface circuit 1200 has two keeper circuits comprising NFET 1210 which has an input coupled to Out 1 of the first circuit, a power node coupled to the power supply voltage potential VG 1208 in the second power domain 1250 and an output coupled back to the first input 1In 1 of the first circuit. In this embodiment the first power domain has a positive voltage potential VD 1225 and a ground potential VG 1209. The second power domain 1250 has a positive voltage potential VD 1225 and a ground potential VG 1208. VG 1208 generates power-gated voltage VGR 1223 in response to the second control signal Out 1 at node 1212 which controls the exemplary NFET devices 1213 and 1214. In FIG. 12, NFETs 1213 and 1214 are parallel devices for power-gating block 1224. VG 1208 is coupled to virtual rail VGR 1223. VGR 1223 is powered when the circuits in the second power domain 1250 domain are activated by a logic one on Wake_in 1201 (CS_1).

NFET devices in power-gating block 1224 are activated when Wake-in 1201 transitions to a logic one and PFET 1202 turns OFF and NFET 1203 turns ON thereby turning ON PFET 1207 and pulling output node 1212 to a logic one. A logic one at node 1212 activates power-gating block 1224 by turning ON exemplary NFETs 1213 and 1214. This logic one state may be propagated by output 1215.

A logic one at Wake-in 1201 turns OFF PFET 1202 and turns ON NFET 1203 which are powered by VD 1209 and ground 1209 in the control domain (first power domain). When NFET 1203 turns ON, node 1222 transitions to a logic zero turning ON PFET 1207. With PFET 1206 turning OFF and NFET 1205 turning ON, NFET 1205 pulls node 1220 to a logic zero turning OFF NFET 1211 thereby turning OFF NFET 1211.

A logic one at node 1212 turns ON keeper NFET 1210 and the logic zero at node 1222 is re-enforced by VG 1208 holding PFET 1207 ON. Likewise, the logic zero at node 1220 turns ON keeper PFET 1204 which re-enforces the logic one Wake_in 1201 holding PFET 1206 OFF. Since the activation logic one state at node 1212 is the preferred logic state, both NFET keeper 1210 and PFET keeper 1204 act to re-enforce the logic one state at node 1212. The interface circuit of FIG. 12 assures the activation logic one state at node 1212 is held by the keeper devices as well as assuring that the NFET devices (e.g., 1213 and 1214) in power-gating block 1224 are held OFF by voltage VG 1208 in stead of the higher ground voltage potential VG 1209.

In the interface circuitry 1100 and 1200 the asserted ON states are determined by the potential difference between logic one and logic zero states and asserted OFF states in power-gated blocks are determined by like voltage potentials.

Figure 13:
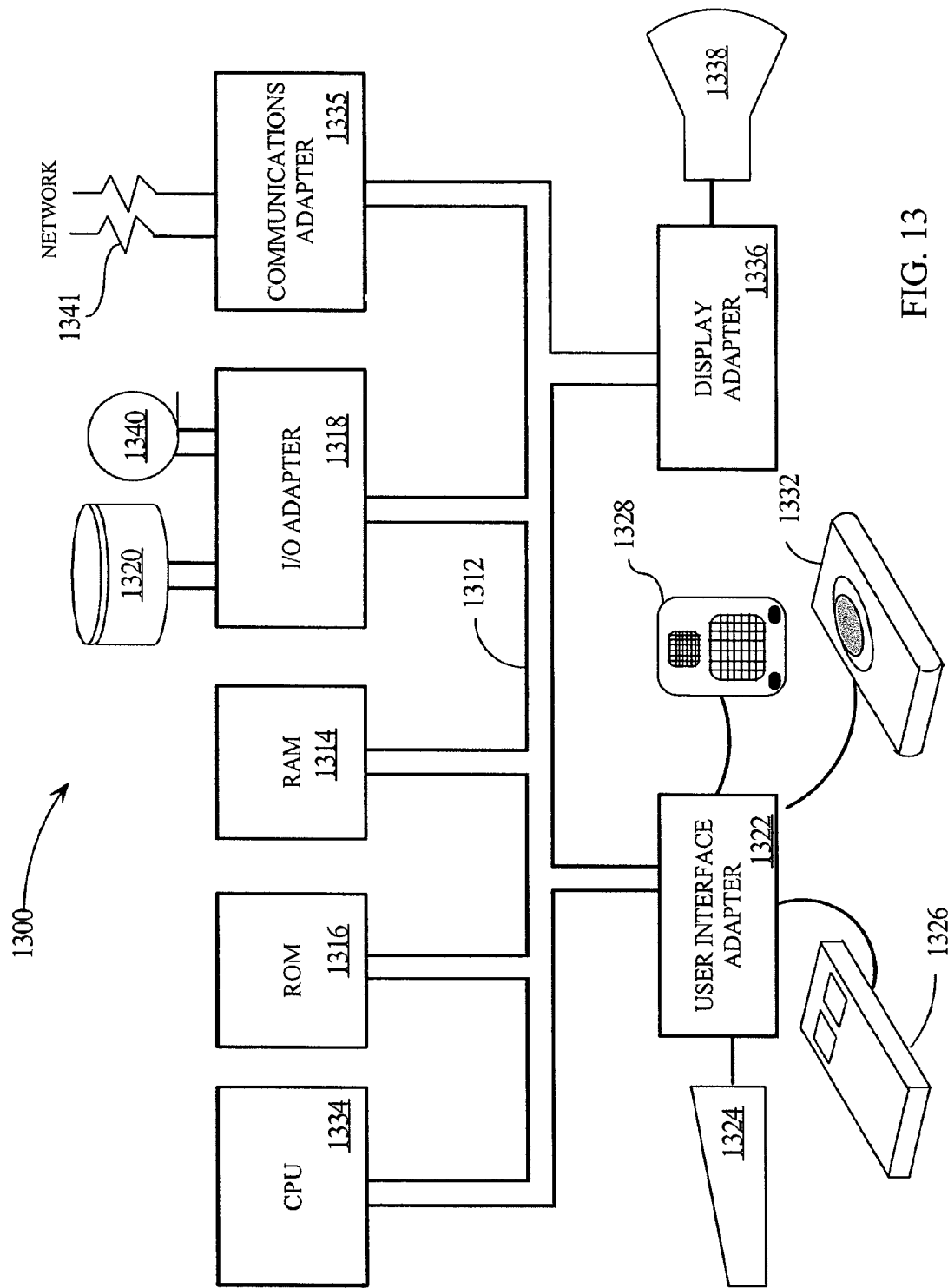
FIG. 13 is a block diagram of a data processing system suitable for practicing embodiments of the present invention.

FIG. 13 is a high level functional block diagram of a representative data processing system 1300 suitable for practicing the principles of the present invention. Data processing system 1300 includes a central processing system (CPU) 1310 operating in conjunction with a system bus 1312. System bus 1312 operates in accordance with a standard bus protocol, such as the ISA protocol, compatible with CPU 1310. CPU 1310 operates in conjunction with electronically erasable programmable read-only memory (EEPROM) 1316 and random access memory (RAM) 1314. Among other things, EEPROM 1316 supports storage of the Basic Input Output System (BIOS) data and recovery code. RAM 1314 includes DRAM (Dynamic Random Access Memory) system memory and SRAM (Static Random Access Memory) external cache. I/O Adapter 1318 allows for an interconnection between the devices on system bus 1312 and external peripherals, such as mass storage devices (e.g., a hard drive, floppy drive or CD/ROM drive), or a printer 1340. A peripheral device 1320 is, for example, coupled to a peripheral control interface (PCI) bus, and I/O adapter 1318 therefore may be a PCI bus bridge. User interface adapter 1322 couples various user input devices, such as a keyboard 1324 or mouse 1326 to the processing devices on bus 1312. Display 1338 which may be, for example, a cathode ray tube (CRT), liquid crystal display (LCD) or similar conventional display units. Display adapter 1336 may include, among other things, a conventional display controller and frame buffer memory. Data processing system 1300 may be selectively coupled to a computer or telecommunications network 1341 through communications adapter 1334. Communications adapter 1334 may include, for example, a modem for connection to a telecom network and/or hardware and software for connecting to a computer network such as a local area network (LAN) or a wide area network (WAN). CPU 1310 and other components of data processing system 1300 may contain interface circuitry for coupling between voltage domains with different ground or positive power supply voltage levels according to embodiments of the present invention.

What is claimed is:

1. An interface circuit for converting a first control signal with logic states of a first power domain to a second control signal with logic states of a second power domain, comprising:
   a first circuit powered from the second power domain and having a first input coupled to the first control signal, a second input, and an output generating the second control signal;
   a second circuit powered from the second power domain and having a first input coupled to a complement of the first control signal having logic states of the first power domain, a second input coupled to the output of the first circuit, and an output coupled to the second input of the first circuit; and
   a first keeper circuit having a power node coupled to the second power domain, an input coupled to the output of the first circuit, and an output coupled to the first input of the first circuit, wherein a first logic state of the second control signal is asserted in response to the first logic state of the complement of the first control signal, a second logic state of the second control signal is asserted in response to the first logic state of the first control signal, and the second logic state of the second control signal is held in response to the second logic state of the second control signal.

2. The interface circuit of claim 1, wherein the first circuit comprises a first field effect transistor (FET) device having a source node coupled to the first voltage potential of the second power domain, a gate node coupled as the second input of the first circuit and a drain node coupled as the output of the first circuit.

3. The interface circuit of claim 2, wherein the first circuit further comprises a second FET device having a source node coupled to a second voltage potential of the second power domain, a gate node coupled as the first input of first circuit, and a drain node coupled to the output of the first circuit.

4. The interface circuit of claim 3, wherein the second circuit comprises a third FET device having a source node coupled to the first voltage potential of the second power domain, a gate node coupled as the second input of the second circuit and a drain node coupled as the output of the second circuit.

5. The interface circuit of claim 4, wherein the second circuit further comprises a fourth FET device having a source node coupled to the second voltage potential of the second power domain, a gate node coupled as the first input of second circuit, and a drain node coupled to the output of the second circuit.

6. The interface circuit of claim 5, wherein the first keeper circuit comprises a fifth FET device having a gate node coupled to the output of the interface circuit, a source node coupled to the first voltage potential of the second power domain and a drain node coupled to the first input of the first circuit.

7. The interface circuit of claim 6 further comprising a second keeper circuit having power node coupled a second voltage potential of the second power domain, an input coupled to the output of the second circuit, and an output coupled to the first input of the second circuit, wherein the first logic state of the second control signal is asserted in response to the first logic state of the complement of the first control signal, a second logic state of the second control signal is asserted in response to the first logic state of the first control signal, and the second logic state of the second control signal is held in response to the second logic state of the second control signal.

8. The interface circuit of claim 7, wherein the second keeper circuit comprises a sixth FET device having a gate node coupled to the output of the second circuit, a source node coupled to the second voltage potential of the second power domain and a drain node coupled to the first input of the second circuit.

9. The interface circuit of claim 6, wherein the first, third, and fifth FET device devices are PFET devices and the second and fourth FET devices are NFET devices.

10. The interface circuit of claim 6, wherein the first, third, and fifth FET devices are NFET devices and the second and fourth FET devices are PFET devices.

11. The interface circuit of claim 8, wherein the first, third, and fifth FET devices are PFET devices and the second, fourth, and sixth FET devices are NFET devices.

12. The interface circuit of claim 8, wherein the first, third, and fifth FET devices are NFET devices and the second, fourth, and sixth FET devices are PFET devices.

13. A data processing system comprising a central processing unit (CPU) as one or more integrated circuits with an interface circuitry for converting
   a first control signal with logic states of a first power domain to a second control signal with logic states of a second power domain, the interface circuitry having a first circuit powered from the second power domain and having a first input coupled to the first control signal, a second input, and an output generating the second control signal, a second circuit powered from the second power domain and having a first input coupled to a complement of the first control signal having logic states of the first power domain, a second input coupled to the output of the first circuit, and an output coupled to the second input of the first circuit, and a first keeper circuit having power node coupled a first voltage potential of the second power domain, an input coupled to the output of the first circuit, and an output coupled to the first input of the first circuit, wherein a first logic state of the second control signal is asserted in response to the first logic state of the complement of the first control signal, a second logic state of the second control signal is asserted in response to the first logic state of the first control signal, and the second logic state of the second control signal is held in response to the second logic state of the second control signal.

14. The interface circuit of claim 13, wherein the first circuit comprises a first field effect transistor (FET) device having a source node coupled to the first voltage potential of the second power domain, a gate node coupled as the second input of the first circuit and a drain node coupled as the output of the first circuit.

15. The interface circuit of claim 14, wherein the first circuit further comprises a second FET device having a source node coupled to a second voltage potential of the second power domain, a gate node coupled as the first input of first circuit, and a drain node coupled to the output of the first circuit.

16. The interface circuit of claim 15, wherein the second circuit comprises a third FET device having a source node coupled to the first voltage potential of the second power domain, a gate node coupled as the second input of the second circuit and a drain node coupled as the output of the second circuit.

17. The interface circuit of claim 16, wherein the second circuit further comprises a fourth FET device having a source node coupled to the second voltage potential of the second power domain, a gate node coupled as the first input of second circuit, and a drain node coupled to the output of the second circuit.

18. The interface circuit of claim 17, wherein the first keeper circuit comprises a fifth FET device having a gate node coupled to the output of the interface circuit, a source node coupled to the first voltage potential of the second power domain and a drain node coupled to the first input of the first circuit.

19. The interface circuit of claim 18 further comprising a second keeper circuit having power node coupled a second voltage potential of the second power domain, an input coupled to the output of the second circuit, and an output coupled to the first input of the second circuit, wherein the first logic state of the second control signal is asserted in response to the first logic state of the complement of the first control signal, a second logic state of the second control signal is asserted in response to the first logic state of the first control signal, and the second logic state of the second control signal is held in response to the second logic state of the second control signal.

20. The interface circuit of claim 19, wherein the second keeper circuit comprises a sixth FET device having a gate node coupled to the output of the second circuit, a source node coupled to the second voltage potential of the second power domain and a drain node coupled to the first input of the second circuit.

* * * * *